United States Patent [19]

Voles

[11] Patent Number: 4,942,301

[45] Date of Patent: Jul. 17, 1990

[54] THERMAL IMAGING DEVICE

[75] Inventor: Roger Voles, London, England

[73] Assignee: Thorn EMI Electronics Limited, Hayes, England

[21] Appl. No.: 359,882

[22] Filed: Jun. 1, 1989

[30] Foreign Application Priority Data

Jun. 1, 1988 [GB] United Kingdom ............... 8812958

[51] Int. Cl.⁵ ............................................ H01L 27/14
[52] U.S. Cl. ................................. 250/338.3; 250/332
[58] Field of Search .................... 250/338.3, 332, 349, 250/380

[56] References Cited

U.S. PATENT DOCUMENTS

| | | | |
|---|---|---|---|
| 4,060,729 | 11/1977 | Byer et al. | 250/338.3 |
| 4,214,165 | 7/1980 | Agawa | 250/338.3 |
| 4,469,943 | 9/1984 | Turnbull | 250/338.3 |
| 4,532,424 | 7/1985 | Cheung | 250/338.3 |
| 4,660,066 | 4/1987 | Reid | 357/30 |
| 4,754,139 | 9/1988 | Ewnulat et al. | 250/332 |

*Primary Examiner*—Constantine Hannaher
*Assistant Examiner*—Edward J. Glick
*Attorney, Agent, or Firm*—Fleit, Jacobson, Cohn, Price, Holman & Stern

[57] ABSTRACT

A pyroelectric film has a pattern of interconnected electrodes formed on one major surface, and a pattern of discrete electrodes and electrically conductive contacts formed on the other major surface. Each discrete electrode is connected to a respective contact by a respective strip of electrically conductive material. Regions of the film each including a contact and part of the associated strip are formed in tongues pulled out of the plane of the film. The contacts are thus able to make electrical contact with respective input terminals of an integrated circuit.

9 Claims, 2 Drawing Sheets

THERMAL IMAGING DEVICE

This invention relates to thermal imaging devices and in particular to thermal imaging devices compromising an array of pyroelectric detector elements respomsive to infrared radiation.

BACKGROUND OF THE INVENTION

The main factor limiting the performance of existing pyroelectric imagers is the thermal conductance between adjacent detector elements and between each detector element and the supporting and interrogating structure.

U.K. Patent Application No. 2163596A discloses a thermal imaging device comprising a ferroelectric slab bearing a common electrode on one main surface and a signal electrode structure on the opposite main surface. The signal electrode structure is electrically connected to electrodes of a signal processing means by conductors. The transverse heat conduction between adjacent conductors is reduced by incorporating each conductor on a bore in a respective pillar of thermally insulating material, the pillars also being effective to support the ferroelectric slab.

It is an object of the invention to provide an alternative thermal imaging device which avoids the use of such pillars.

SUMMARY OF THE INVENTION

According to the present invention a thermal imaging device comprises: a layer comprising pyroelectric material; an array of discrete electrodes carried on one major surface side of the layer; an array of interconnected electrodes carried on the other major surface of the layer so as to define with the layer and discrete electrodes an array of pyroelectric detector elements; an array of electrically conductive contacts carried on said one surface of the layer, each conductive contact being connected to a respective discrete electrode by an elongate electrically conductive strip, portions of the layer each carrying at least one contact and part of the associated conductive strip being formed into tongues attached to the major portion of the layer along only part of their peripheries, the free ends of the tongues being pulled out of the plane of the layer, each contact being electrically connected to a respective input of a signal processing means.

Thus an electrical connection is provided between the detector elements and the signal processing means without the use of separate pillars.

The pyroelectric material in the device may comprise material which is inherently pyroelectric, or material whose pyroelectric characteristics are induced (e.g. by appropriate poling of ferroelectric material). Suitable inherently pyroelectric materials are polyvinylidene fluoride (PVDF) or a copolymer of vinylidene fluoride with, for example, trifluoroethylene. Alternatively a pyroelectric Langmuir-Blodgett film deposited on a flexible substrate may be used.

The layer is suitably a flexible film.

The length to width ratio of the conductive strips is preferably at least 5.

The arrays of discrete electrodes and contacts are preferably intercalated.

Each tongue may carry two contacts.

Further tongues may be formed in the layer, the further tongues being pulled out of the plane of the layer in the opposite direction to the tongues carrying the contacts, the two sets of tongues together being used to locate the pyroelectric detector array in a housing.

The use of a thin pyroelectric film and of long, narrow conductors to connect the discrete electrodes to the integrated circuit ensures that the thermal conductance from each pixel to the relevant input pad on the integrated circuit is small.

Two thermal imaging devices in accordance with the present invention will now be described, by way of example only, with reference to the accompanying drawings of which:

DETAILED DESCRIPTION OF THE PREFERRED EMBODIMENT

Figure 1:
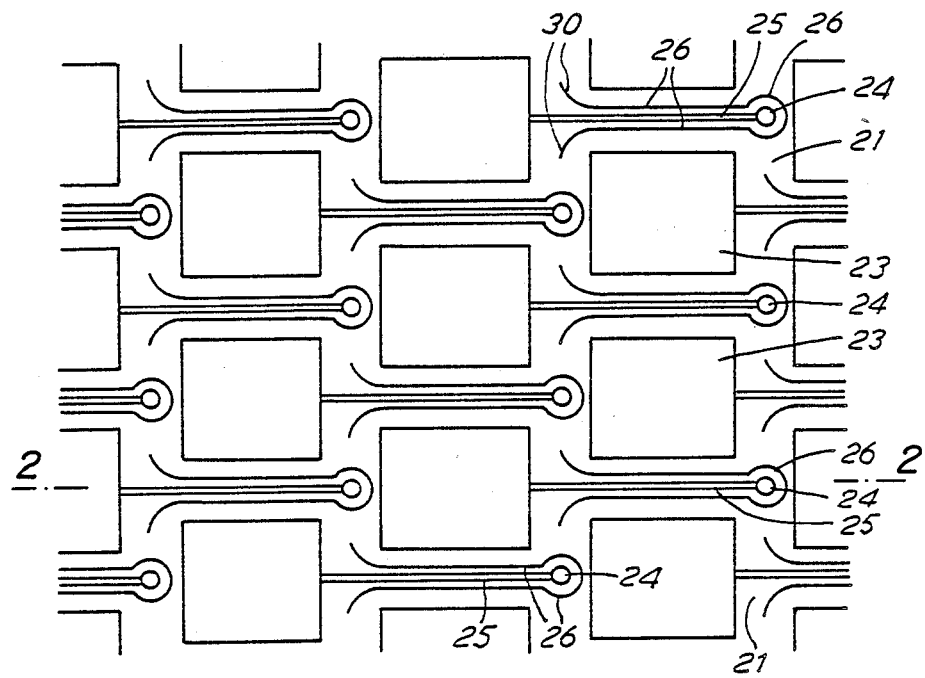
FIG. 1 is a schematic sectional view of part of the first device illustrating the surface of the pyroelectric layer carrying the discrete electrodes.
Figure 2:
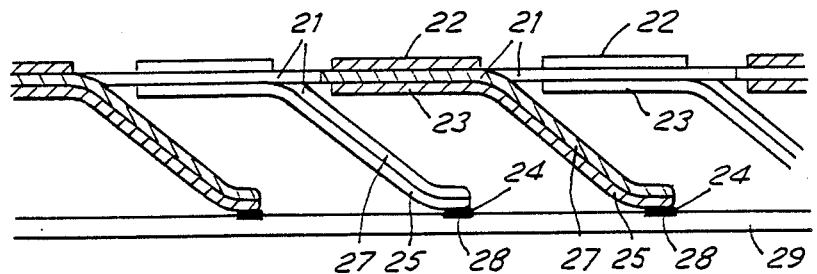
FIG. 2 shows an elevation view of a cross section at line 2—2 in FIG. 1.

In the first device shown in FIGS. 1 and 2, a pyroelectric film 21 of for example PVDF has a pattern of interconnected gold electrodes 22 formed on one surface and a pattern of discrete gold electrodes 23 formed on the other surface. The film 21, interconnected electrodes 22 and discrete electrodes 23 together are effective to define an array of pyroelectric detector elements. On the surface of the film 21 between the discrete electrodes 23, there is formed an intercalated pattern of electrically conductive patches 24. Each discrete electrode 23 is connected to a respective patch 24 by a long, narrow electrical conductor 25, which passes between the adjacent discrete electrodes 23. A slit 26 is cut in the film 21 around each patch 24 and along either side of the relevant conductor 25, thereby forming a tongue or strip 27 of the film which is pulled out of the plane of the film. Each patch 24 at the end of a respective strip 27 is bonded to a respective input pad 28 of an integrated circuit 29 arrangement whicn in use of the device performs signal processing of the electrical signals generated by the pyroelectric detector elements. Optionally, the slits 26 may be flared at the ends to widen the strip, as shown at 30, reducing the thermal conductance between adjacent pyroelectric elements on either side of the flared regions 30. The film 21 and the integrated circuit 29 are kept apart by suitable spacers (not shown in the Figures).

Figure 3:
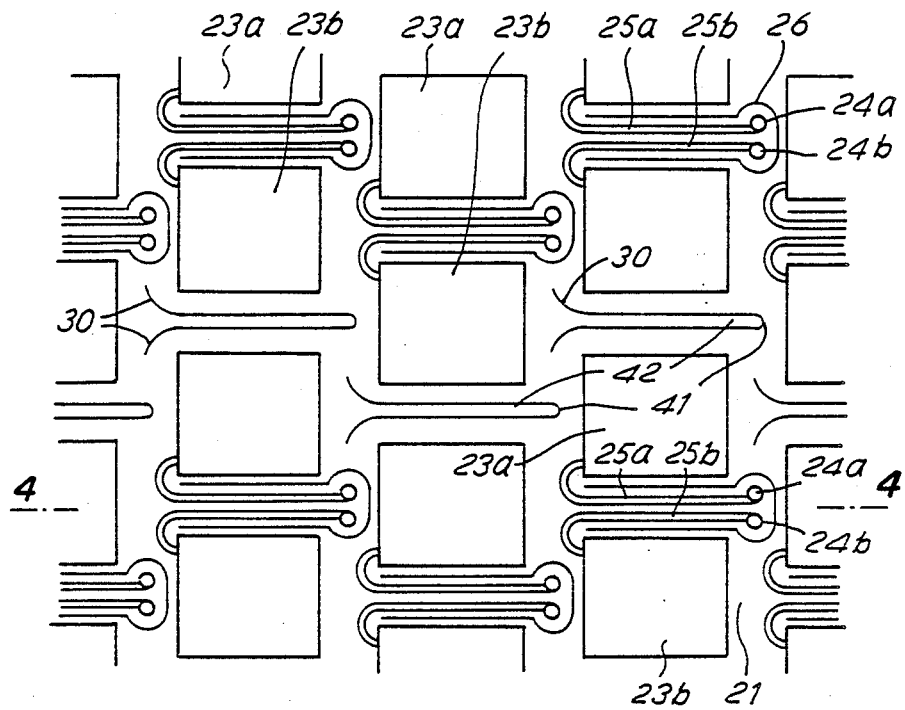
FIG. 3 is a schematic sectional view of part of the second device illustrating the surface of the pyroelectric layer carrying the discrete electrodes.
Figure 4:
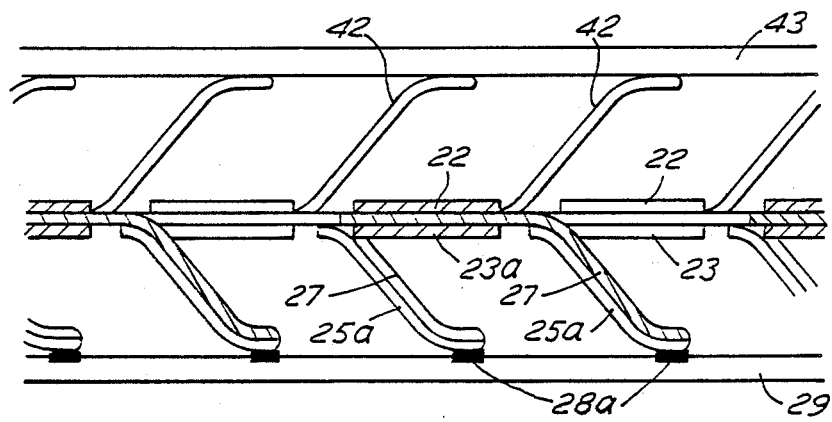
FIG. 4 shows an elevation view of a cross section at line 4—4 in FIG. 3.

In the second device shown in FIGS. 3 and 4, corresponding features to those of the first device are correspondingly labelled. A pyroelectric film 21 has a pattern of interconnected electrodes 22 formed on one side and a pattern of pairs of discrete electrodes 23a, 23b and electrically conductive patches 24a, 24b formed on the other side. Each discrete electrodes 23a or 23b is connected to a respective patches 24a or 24b by a respective electrical conductors 25a or 25b which passes between the adjacent electrodes 23a or 23b. The second device differs from the first device however in that a slit 26 is cut in the film around each pair of patches 24a, 24b and along either side of the relevant pair of conductors 25a, 25b, thereby forming a strip 27 which is pulled out of the plane of the film. Each patch 24a or 24b is bonded to a respective input pads 28a or 28b (not shown) of an integrated circuit 29. Further slits 41 may be cut in the film 21 between adjacent pairs of discrete electrodes, the slits being U-shaped to form strips 42 which are pulled out of the plane of the film and attached to a transparent cover plate 43 on the side of the film remote from the integrated circuit 29. These slits 41 are flared at the ends adjacent to the discrete electrodes 23a or 23b to widen the strip, as shown at 30, reducing the thermal conductance between adjacent pyroelectric detector elements on either side of the flared regions 30. The film 21 is kept apart from the integrated circuit 29 and from the cover plate (preferably formed of glass) 43 by suitable spacers (not shown in the Figures). The combination of strips 27 and strips 42 are thus effective to maintain an equal spacing from the cover plate 43 and from the integrated circuit 29 of each pyroelectric detector element.

The inter-connected electrodes 22 are covered by an infrared absorbent layer (not shown), for example a layer of black gold. The inter-connections between these electrodes should be narrow, thin and preferably meandered to increase their length. They should also be connected to ground.

Clearly, embodiments of the present invention are not restricted to the particular shapes of electrodes shown and described herein before. Thus, the electrodes can be of a complex shape; in an advantageous form, the shape of the electrodes conforms to the isothermal-resistance contours of the device, such that the electrodes are located in regions wherein the thermal resistance to ground has a relatively high value (preferably being at its highest).

It will be appreciated that whilst it is particularly convenient to form the pyroelectric layer from a flexible film of pyroelectric material, for example, a pyroelectric polymer, the invention is also applicable to devices in which the layer of pyroelectric material is a composite layer comprising an array of discrete regions of pyroelectric material carried on a flexible substrate, for example, of polyimide. The tongues will then be formed from regions of the flexible substrate, which do not necessarily carry pyroelectric regions.

I claim:

1. A thermal imaging device comprising: a layer comprising pyroelectric material; an array of discrete electrodes carried on one major surface side of the layer; an array of interconnected electrodes carried on the other major surface of the layer so as to define with the layer and discrete electrodes an array of pyroelectric detector elements; an array of electrically conductive contacts carried on said one surface of the layer, each conductive contact being connected to a respective discrete electrode by an elongate electrically conductive strip, portions of the layer each carrying at least one contact and part of the associated conductive strip being formed into tongues attached to the major portion of the layer along only part of their peripheries, the free ends of the tongues being pulled out of the plane of the layer, each contact being electrically connected to a respective input of a signal processing means.

2. A device according to claim 1 in which the arrays of discrete electrodes and contacts are intercalated.

3. A device according to claim 1 in which each tongue carries two contacts.

4. A device according to claim 1 in which further tongues are formed in the layer, the further tongues being pulled out of the plane of the layer in the opposite direction to the tongues carrying the contacts, the two sets of tongues together locating the pyroelectric detector array in a housing.

5. A device according to claim 1 in which the tongues or further tongues are formed with an enlarged portion at the end attached to the major portion of the layer.

6. A device according to claim 1 in which the layer is a flexible film.

7. A device according to claim 6 in which the pyroelectric material is polyvinylidene fluoride or a copolymer of vinylidene.

8. A device according to claim 1 in which the layer is a composite layer comprising pyroelectric material carried on a flexible substrate.

9. A device according to claim 8 in which at least part of the tongues do not carry pyroelectric material.

* * * * *